(12) United States Patent
Hong et al.

(10) Patent No.: US 9,269,813 B2
(45) Date of Patent: Feb. 23, 2016

(54) FIELD EFFECT TRANSISTOR

(71) Applicant: Samsung Electronics Co., Ltd., Suwon-si (KR)

(72) Inventors: Soohun Hong, Gunpo-Si (KR); Heesoo Kang, Seoul (KR); Dongho Cha, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/133,064

(22) Filed: Dec. 18, 2013

(65) Prior Publication Data
US 2014/0183599 A1    Jul. 3, 2014

(30) Foreign Application Priority Data

Jan. 2, 2013   (KR) .................. 10-2013-0000276

(51) Int. Cl.
*H01L 29/78*    (2006.01)
*H01L 29/66*    (2006.01)
*H01L 29/165*    (2006.01)

(52) U.S. Cl.
CPC ........ *H01L 29/785* (2013.01); *H01L 29/66545* (2013.01); *H01L 29/7848* (2013.01); *H01L 29/165* (2013.01)

(58) Field of Classification Search
CPC ............ H01L 29/66795; H01L 29/785; H01L 27/0886
USPC ......................................................... 257/401
See application file for complete search history.

(56) References Cited

U.S. PATENT DOCUMENTS

| | | | |
|---|---|---|---|
| 6,853,031 | B2 | 2/2005 | Liao et al. |
| 7,268,396 | B2 | 9/2007 | Lee et al. |
| 7,385,247 | B2 | 6/2008 | Rhee et al. |
| 7,585,734 | B2 | 9/2009 | Kang et al. |
| 7,671,420 | B2 | 3/2010 | Shin et al. |
| 7,915,693 | B2 | 3/2011 | Okano |
| 8,629,512 | B2 * | 1/2014 | Liaw .............................. 257/401 |
| 2005/0051825 | A1 | 3/2005 | Fujiwara et al. |
| 2007/0075372 | A1 | 4/2007 | Terashima et al. |
| 2007/0170474 | A1 | 7/2007 | Kawasaki |
| 2008/0087933 | A1 | 4/2008 | Chung et al. |
| 2012/0091538 | A1 * | 4/2012 | Lin et al. ........................ 257/401 |

FOREIGN PATENT DOCUMENTS

| | | |
|---|---|---|
| JP | 2005-086024 | 3/2005 |
| KR | 10-2008-0011511 A | 2/2008 |
| KR | 10-2009-0110679 A | 10/2009 |

* cited by examiner

*Primary Examiner* — Robert Carpenter
(74) *Attorney, Agent, or Firm* — Myers Bigel Sibley & Sajovec, P.A.

(57) ABSTRACT

Field effect transistors are provided. An active region protrudes from a substrate and a gate electrode is provided on the active region. Source/drain regions are provided at both sides of the active region under the gate electrode, respectively. A width of a lower portion of the gate electrode is greater than a width of an upper portion of the gate electrode.

19 Claims, 21 Drawing Sheets

FIELD EFFECT TRANSISTOR

CROSS-REFERENCE TO RELATED APPLICATIONS

This U.S. non-provisional patent application claims priority under 35 U.S.C. §119 to Korean Patent Application No. 10-2013-0000276, filed on Jan. 2, 2013, the disclosure of which is incorporated by reference herein in its entirety.

BACKGROUND

The inventive concepts relate to field effect transistors and, more particularly, to field effect transistors including active regions protruding from a substrate.

Semiconductor devices can perform many different functions. For example, semiconductor devices may include semiconductor memory devices that store logic data, semiconductor logic devices that process operations of logic data, and hybrid semiconductor devices that have both the function of semiconductor memory devices and the function of semiconductor logic devices. With the development of the electronic industry, semiconductor devices with improved performance characteristics are increasingly demanded. For example, there is increasing demand for semiconductor devices with high reliability, high speed, and/or multi-function capability. To satisfy the demands, the complexity of structures in the semiconductor devices has been increased, and the semiconductor devices have become more highly integrated.

SUMMARY

Embodiments of the inventive concept may provide field effect transistors capable of effectively using a sidewall of an active region protruding from a substrate as a channel.

In one aspect, a field effect transistor may include: an active region protruding from a substrate; a gate electrode provided on the active region; and source/drain regions disposed at both sides of the active region under the gate electrode, respectively. A lower width of the gate electrode may be greater than an upper width of the gate electrode.

In some embodiments, a sidewall of the gate electrode may have a slope that is not perpendicular to a top surface of the substrate.

In some embodiments, the sidewall of the gate electrode may have a concave shape.

In some embodiments, an upper sidewall of the gate electrode may be substantially perpendicular to a top surface of the substrate; and a lower sidewall of the gate electrode may have a concave slope.

In some embodiments, a width of the active region contacting the source/drain regions may become progressively greater from a top end of the active region toward a bottom end of the active region.

In some embodiments, a sidewall of each of the source/drain regions contacting the active region may have a convex slope.

In some embodiments, each of both sidewalls of the active region contacting the source/drain regions may have a concave slope.

In some embodiments, the source/drain regions may include a material having a lattice constant greater than that of a material of the active region.

In some embodiments, the material having the great lattice constant may include silicon-germanium (SiGe).

In some embodiments, the field effect transistor may further include: a device isolation layer covering a lower sidewall of the active region. Bottom surfaces of the source/drain regions may be higher than a bottom surface of the device isolation layer.

In some embodiments, top surfaces of the source/drain regions may be higher than a top surface of the active region.

In another aspect, a field effect transistor may include: an active region protruding from a substrate; a gate electrode on the active region; and source/drain regions disposed at both sides of the gate electrode. An interface between the active region and each of the source/drain regions may have a slope that is not perpendicular to a top surface of the substrate; and a sidewall of the gate electrode may have a slope along the interface.

In some embodiments, a lower width of the gate electrode may be greater than an upper width of the gate electrode.

In some embodiments, the sidewall of the gate electrode may have a concave slope.

In some embodiments, each of both sidewalls of the active region contacting the source/drain regions may have a concave slope.

BRIEF DESCRIPTION OF THE DRAWINGS

The inventive concept will become more apparent in view of the attached drawings and accompanying detailed description.

FIG. 1 is a perspective view and FIG. 1A is an exploded view illustrating a field effect transistor according to some embodiments of the inventive concept;

DETAILED DESCRIPTION OF THE EMBODIMENTS

Figure 1A:
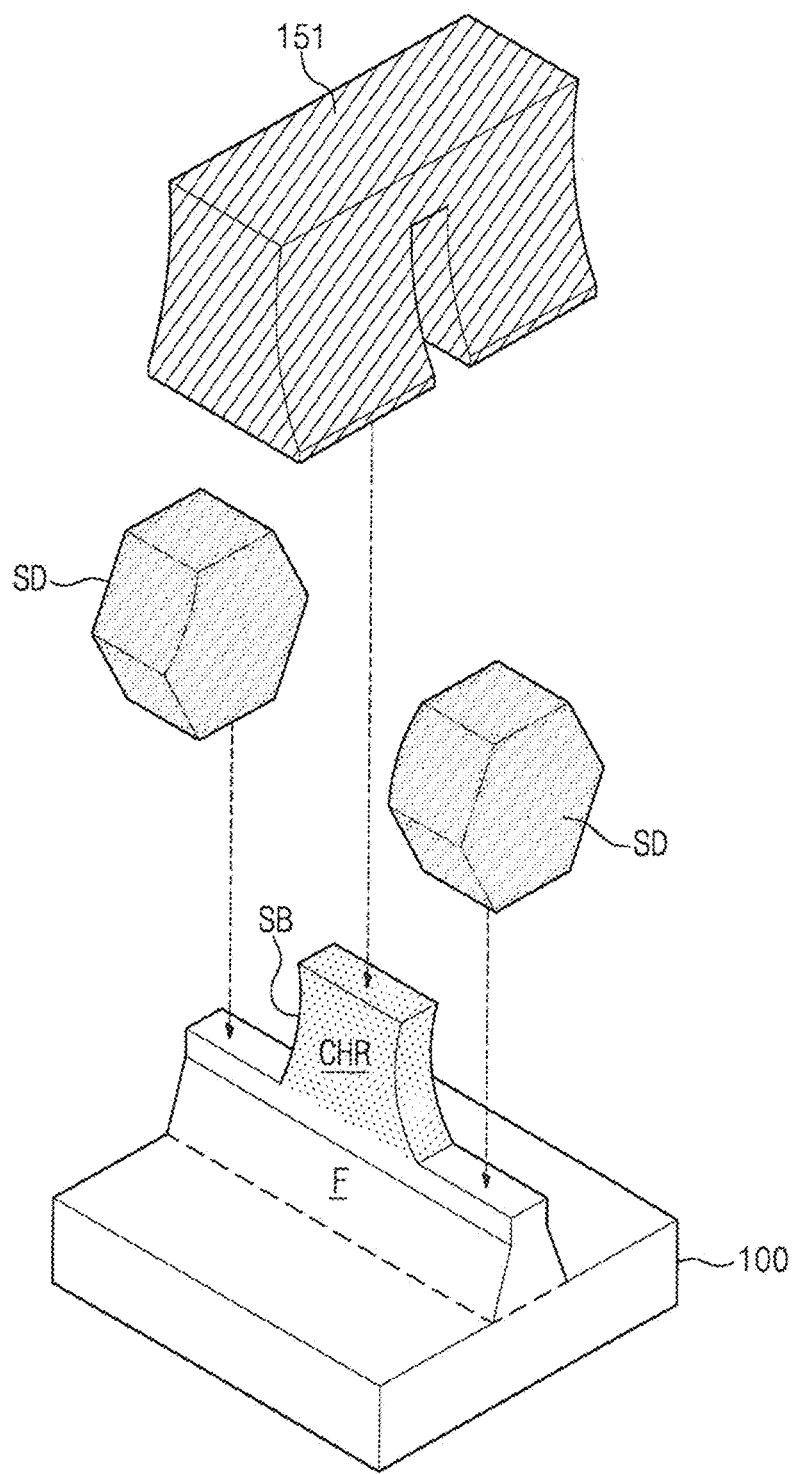

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
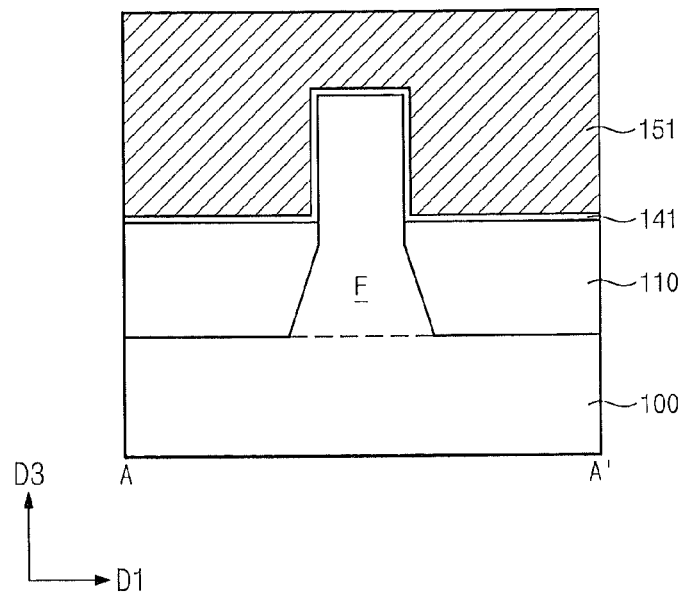
FIG. 2A is a cross-sectional view taken along a line A-A' of FIG. 1.
Figure 2B:
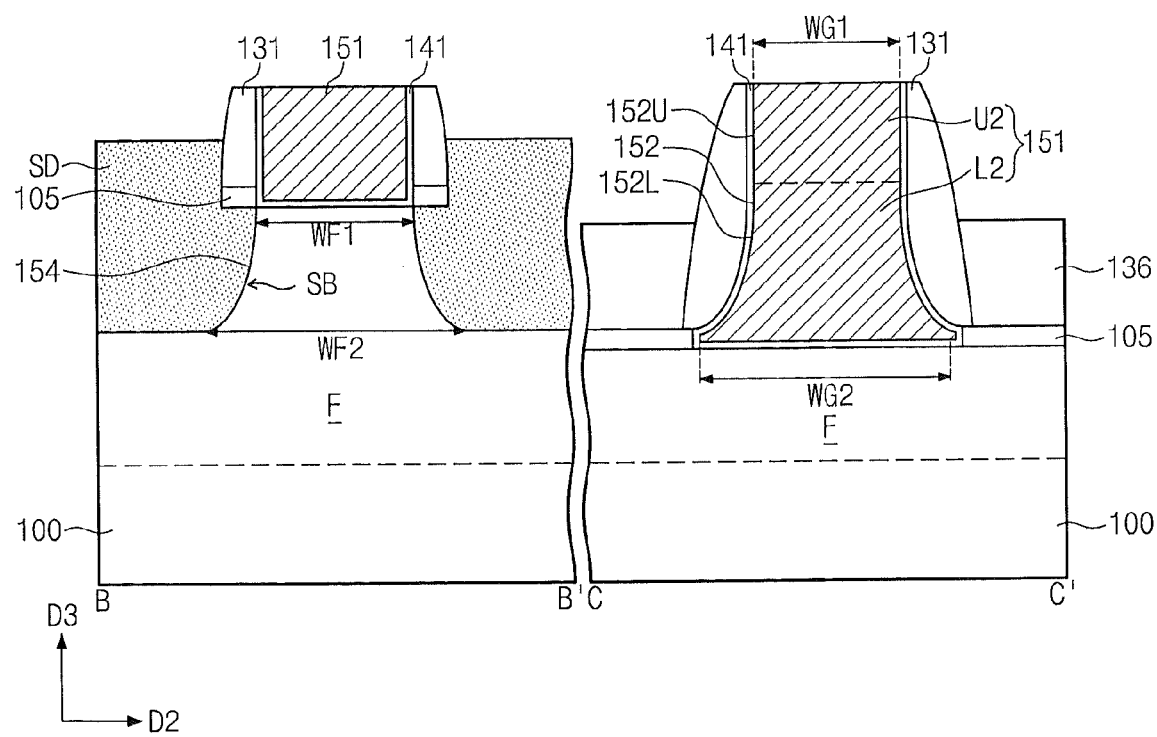
FIG. 2B is a cross-sectional view taken along lines B-B' and C-C' of FIG. 1.
Figure 2C:
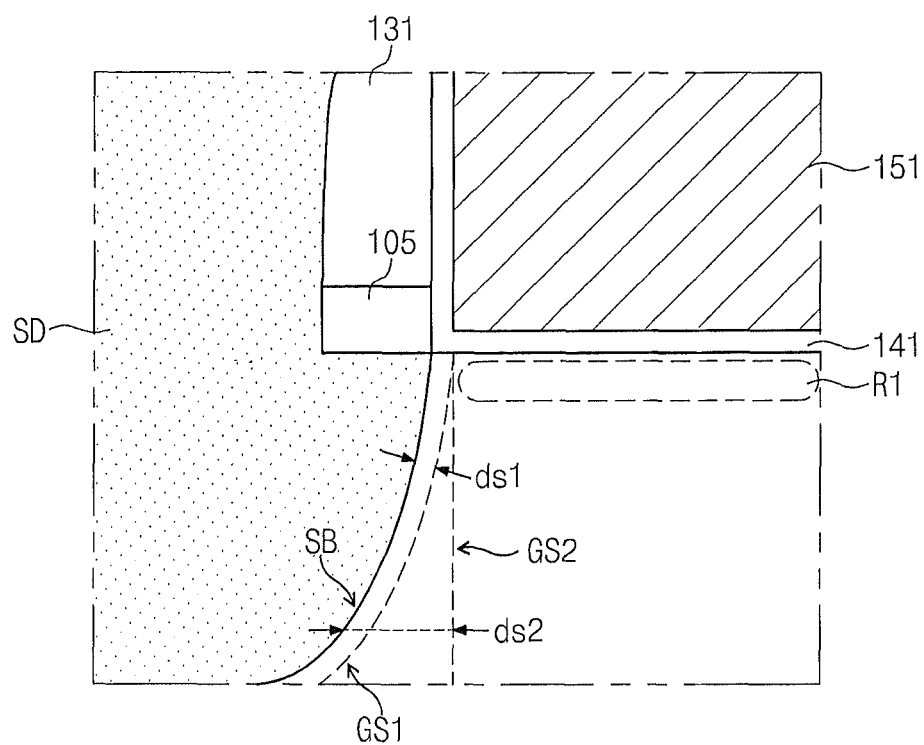
FIG. 2C is an enlarged view of a portion of FIG. 2B.

FIG. 1 is a perspective view and FIG. 1A is an exploded view illustrating a field effect transistor according to some embodiments of the inventive concepts. FIG. 2A is a cross-sectional view taken along a line A-A' of FIG. 1, and FIG. 2B is a cross-sectional view taken along lines B-B' and C-C' of FIG. 1. FIG. 2C is an enlarged view of a portion of FIG. 2B.

Referring to FIGS. 1, 2A, 2B, and 2C, a field effect transistor according to some embodiments will be described. The field effect transistor may be an NMOS transistor or a PMOS transistor. An active region protruding from a substrate 100 may be provided. In an embodiment, the active region may be a fin-shaped active region F. However, the inventive concept is not limited thereto. The substrate 100 may be a semiconductor substrate including silicon, germanium, or silicon-germanium. In an embodiment, the fin active region F may be a portion of the substrate 100 or may include an epitaxial layer grown from the substrate 100. The fin active region F may extend between device isolation layers 110, so as to protrude upward from a top surface of the substrate 100. The device isolation layers 110 may cover a lower sidewall of the fine active region F.

A gate electrode 151 may be provided on the fin active region F. The gate electrode 151 may extend in a first direction D1. The first direction D1 is perpendicular to a second direction D2 that corresponds to a direction of current flow between the source/drain regions SD of the device. A width WG2 of a lower portion L2 of the gate electrode 151 between the source/drain regions SD may be greater than a width WG1 of an upper portion U2 of the gate electrode 151 between the source/drain regions SD. A sidewall 152 of the gate electrode 151 extending in the D1 direction may include a slope that is not perpendicular to a top surface of the substrate 100. An angle of the slope relative to the top surface of the substrate 100 may be within a range of about 60 degrees to about 85 degrees. However, the inventive concept is not limited thereto.

In an embodiment, the sidewall 152 of the gate electrode 151 may have a concave shape. In more detail, a sidewall 152U of the upper portion U2 of the gate electrode 151 may be substantially perpendicular to the top surface of the substrate 100, and a sidewall 152L of the lower portion L2 of the gate electrode 151 may have a concave slope. The gate electrode 151 may include at least one metal layer. In an embodiment, the gate electrode 151 may include titanium, tantalum, tungsten, or aluminum. In another embodiment, the gate electrode 151 may include silicon and/or germanium.

A gate dielectric layer 141 may be provided between the fin active region F and the gate electrode 151. A gate dielectric layer 141 may extend between the gate electrode 151 and a first spacer 131 disposed on the sidewall of the gate electrode 151. The gate dielectric layer 141 may include a high-k dielectric material having a dielectric constant higher than that of silicon oxide. For example, the gate dielectric layer 141 may include hafnium oxide ($HfO_2$), zirconium oxide ($ZrO_2$), or tantalum oxide ($Ta_2O_5$). The first spacer 131 may include at least one of silicon oxide, silicon nitride, and silicon oxynitride. A protection layer 105 (e.g., a silicon oxide layer) may be provided under the first spacer 131.

Source/drain regions SD may be provided on opposing sides of the fin active region F under the gate electrode 151, respectively. In other words, the source/drain regions SD may also be disposed at both sides of the gate electrode 151, respectively. The source/drain regions SD may be spaced apart from each other in a second direction D2 crossing the first direction D1 with the fin active region F disposed under the gate electrode 151 therebetween. The source/drain regions SD may penetrate an interlayer insulating layer 136 so as to be connected to the fin active region F. In an embodiment, top surfaces of the source/drain regions SD may be elevated source/drain shapes having top surfaces higher than a top surface of the fin active region F. The source/drain regions SD may be insulated from the gate electrode 151 by the first spacer 131.

The source/drain regions SD may be in contact with both sidewalls of the fin active region F under the gate electrode 151, respectively. The fin active region F contacting the source/drain regions SD may have an upper width WF1 and a lower width WF2 that is greater than the upper width WF1, as illustrated in FIG. 2B. In other words, the sidewall 154 of the fin active region F contacting the source/drain regions SD may have a slope that is not perpendicular to the top surface of the substrate 100. In an embodiment, the sidewall 154 of the fin active region F contacting the source/drain regions SD may have a concave slope.

Shapes of the source/drain regions SD may be determined depending on a shape of the fin active region F. In other words, an interface SB between the fin active region F and the source/drain region SD may have a slope that is not perpendicular to the top surface of the substrate 100. In an embodiment, a sidewall of the source/drain region SD contacting the fin active region F may have a convex slope. Bottom surfaces of the source/drain regions SD may be higher than bottom surfaces of the device isolation layers 110.

If the field effect transistor is the PMOS transistor, the source/drain regions SD may be compressive stress patterns. In an embodiment, the compressive stress pattern may include a material having a lattice constant greater than that of silicon, for example, a silicon-germanium (SiGe) pattern. The compressive stress pattern may apply a compressive stress to the fin active region F to improve a mobility of charges of a channel region CHR. Alternatively, if the field effect transistor is the NMOS transistor, the source/drain regions SD may be formed of the same material as the substrate 100. in an embodiment, if the substrate 100 is a silicon substrate, the source/drain regions SD may include silicon.

The shape of the field effect transistor according to embodiments and effects obtained by the same will be described in more detail with reference to FIG. 2C.

As described above, the interface SB (hereinafter, referred to as 'a junction') between the fin active region F and the source/drain region SD may have a slope that is not perpendicular to the top surface of the substrate 100.

A three-dimensional (3D) field effect transistor such as the field effect transistor according to embodiments of the inventive concept may use a sidewall and an upper portion (e.g., R1 of FIG. 2C) of an active region as a channel. In other words, the 3D field effect transistor may use various surfaces of the active region as the channel, unlike a two-dimensional transistor. However, a profile of the junction SB may have a slope that is formed according to a process condition, such as a recipe of an etching process, as illustrated in FIG. 2C. In this case, it may be difficult to use a sloped portion of the sidewall of the active region as the channel. In FIG. 2C, a line GS1 presents a sidewall profile of the gate electrode 151 taken along the line C-C' of FIG. 1. In the case that the gate electrode 151 has the profile of the line GS1, the sidewall of the gate electrode 151 may have a slope along the profile of the junction SB having a slope that is not perpendicular to the top surface of the substrate 100. Thus, a first separation distance ds1 that is relatively small may be maintained between the sidewall of the gate electrode 151 and the junction SB. On the other hand, if a sidewall of the gate electrode 151 has a profile that is substantially perpendicular to the top surface of the substrate 100 along a line GS2 of FIG. 2C, a distance ds2 between the gate electrode 151 and the junction SB having the slope may become progressively greater toward a bottom end of the junction SB. In this case, controllability of the gate electrode 151 for the channel region may be reduced and a short channel effect may occur.

According to some embodiments of the inventive concepts, the sidewall profile of the gate electrode 151 may be adjusted to effectively control the channel of the 3D field effect transistor, such that a channel width of the 3D field effect transistor may increase to prevent or reduce the short channel effect.

FIGS. 3 to 6, 8, 10, 12, 14, and 16 are perspective views illustrating methods of manufacturing a field effect transistor according to some embodiments. FIGS. 7A, 9A, 11A, 13A, 15A, and 17A are cross-sectional views taken along lines A-A' of FIGS. 6, 8, 10, 12, 14, and 16, respectively. FIGS. 7B, 9B, 11B, 13B, 15B, and 17B are cross-sectional views taken along lines B-B' and lines C-C' of FIGS. 6, 8, 10, 12, 14, and 16, respectively.

Figure 3:
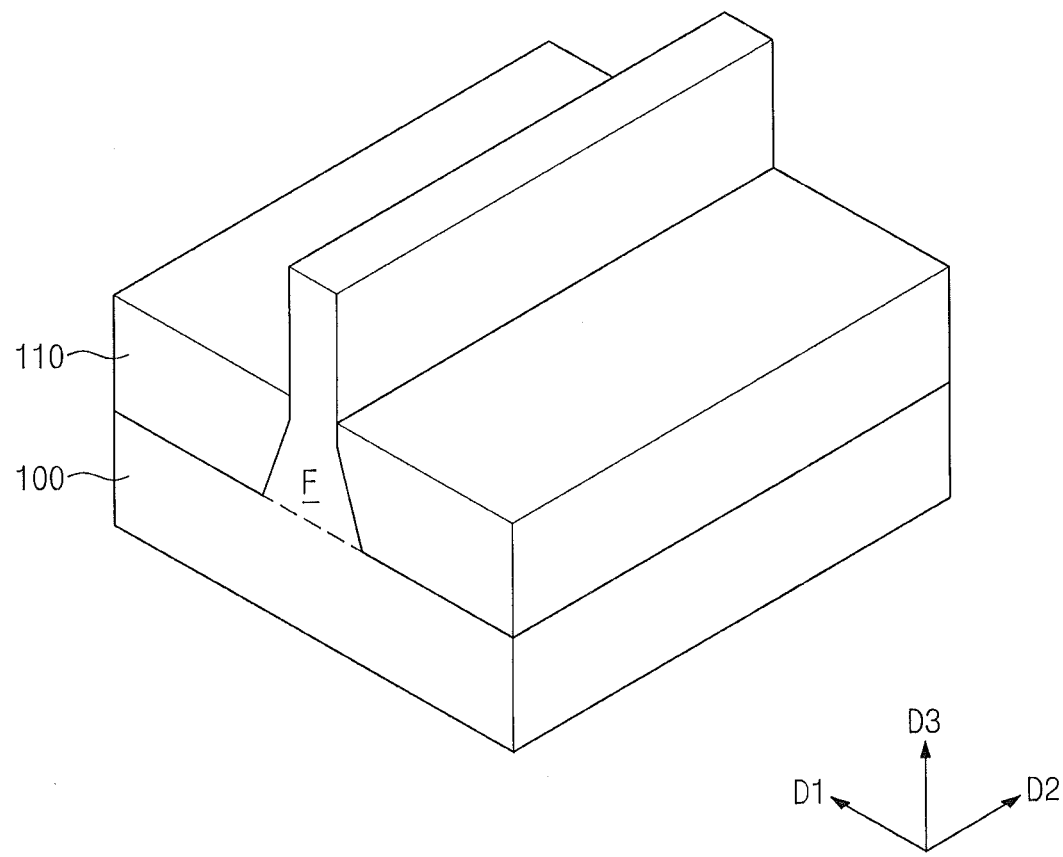
FIGS. 3 to 6, 8, 10, 12, 14, and 16 are perspective views illustrating a method of manufacturing a field effect transistor according to some embodiments of the inventive concept.

Referring to FIG. 3, a fin active region F protruding from a substrate 100 may be formed. In an embodiment, device isolation layers 110 may be formed in the substrate 100 and then upper portions of the device isolation layers 110 may be removed to form the fin active region F. The device isolation layers 110 may be formed of a material including at least one of silicon oxide, silicon nitride, and silicon oxynitride. In another embodiment, an upper portion of the fin active region F that protrudes to be higher than the device isolation layers 110 may be formed by an epitaxial growth process.

Figure 4:
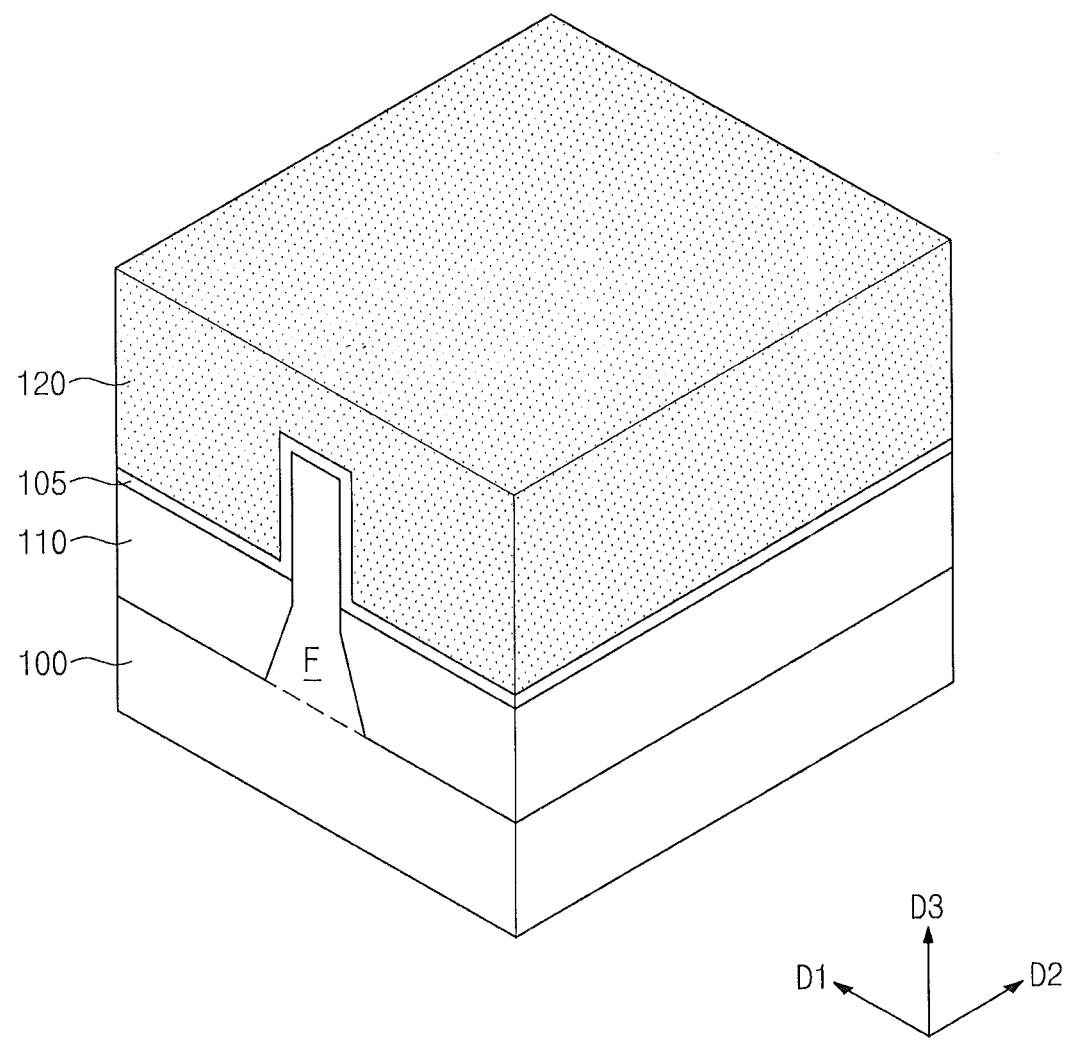

Referring to FIG. 4, a protection layer 105 and a conductive layer 120 may be sequentially formed on the fin active regions F. The protection layer 105 may be an insulating layer including one of a silicon oxide layer, a silicon nitride layer, and a silicon oxynitride layer. The conductive layer 120 may include poly-silicon. In an embodiment, each of the protection layer 105 and the conductive layer 120 may be formed by a chemical vapor deposition (CVD) process.

Figure 5:
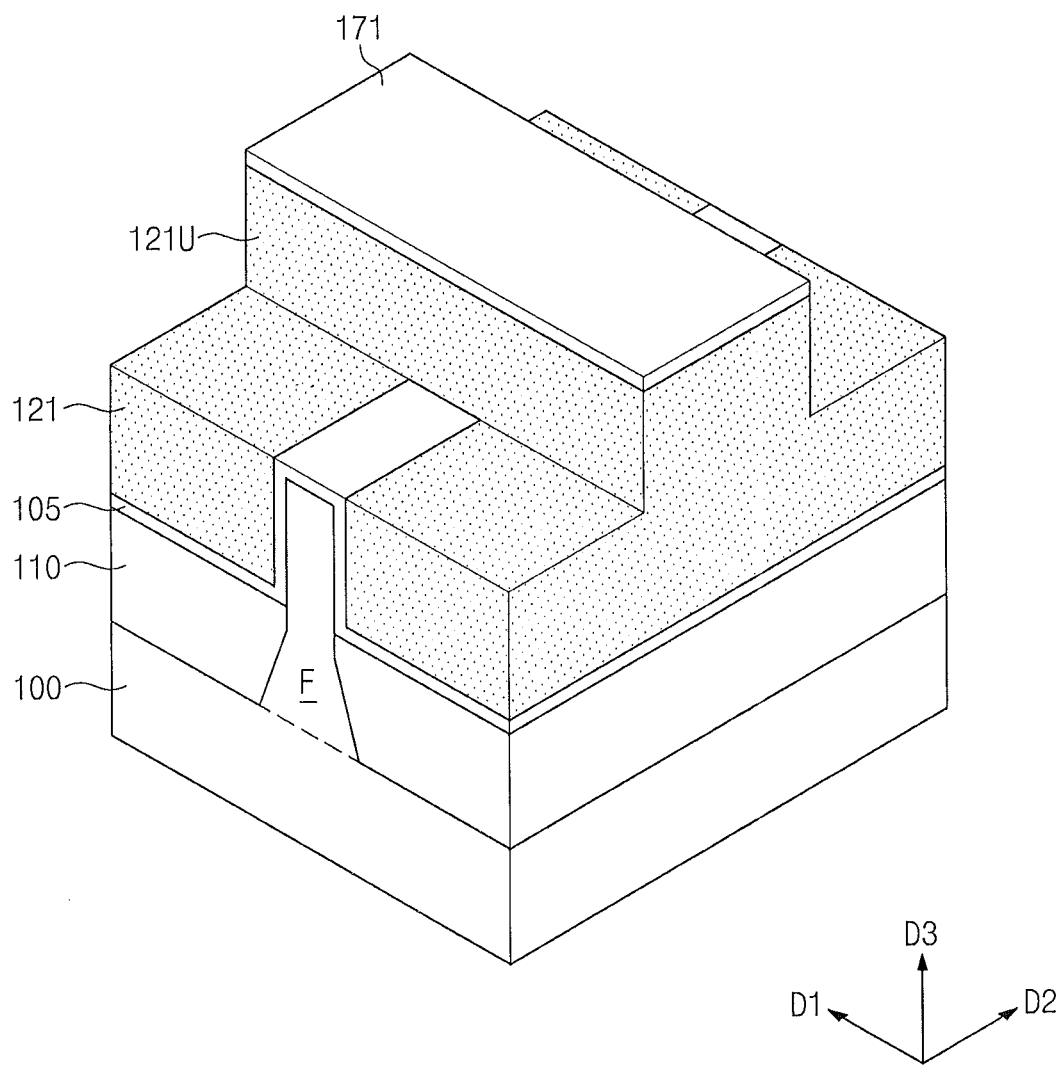

Referring to FIG. 5, a portion of the conductive layer 120 may be patterned. In particular, a mask pattern 171 may be formed on the conductive layer 120 and a first etching process may be performed on the conductive layer 120 using the mask pattern 171 as an etch mask. The first etching process may be an anisotropic etching process. As a result, a sidewall 121U of the patterned conductive layer 121 may be substantially perpendicular to a top surface of the substrate 100. The patterned conductive layer 121 may expose the protection layer 105. In other words, the patterning process may be performed using the protection layer 105 as a etch stop layer.

Figure 6:
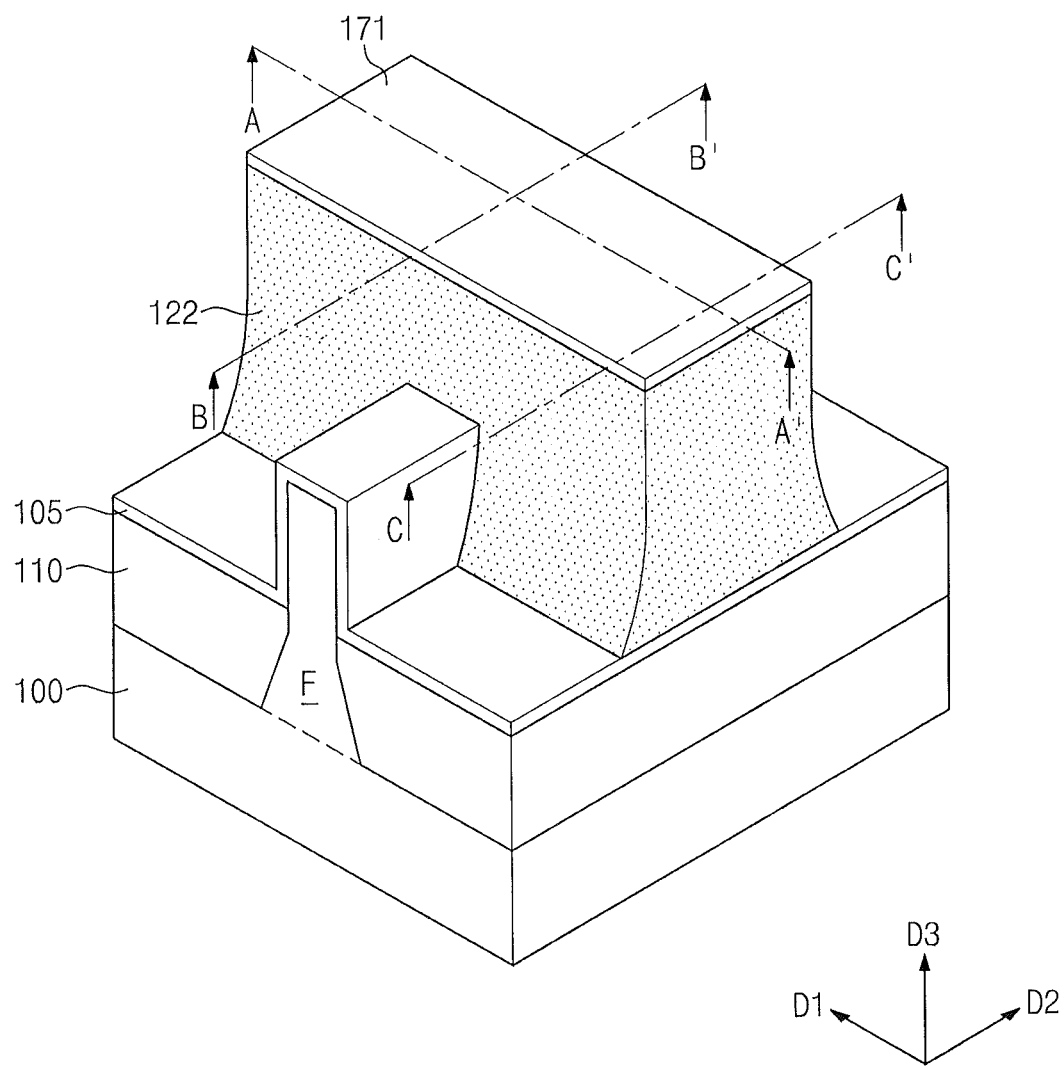
Figure 7A:
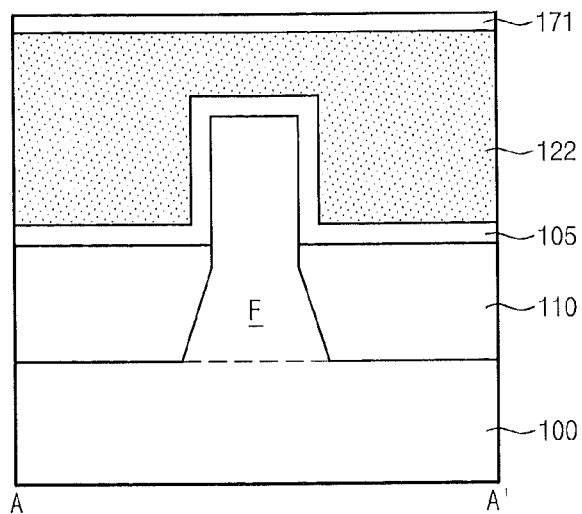
FIGS. 7A, 9A, 11A, 13A, 15A, and 17A are cross-sectional views taken along lines A-A' of FIGS. 6, 8, 10, 12, 14, and 16, respectively.
Figure 7B:
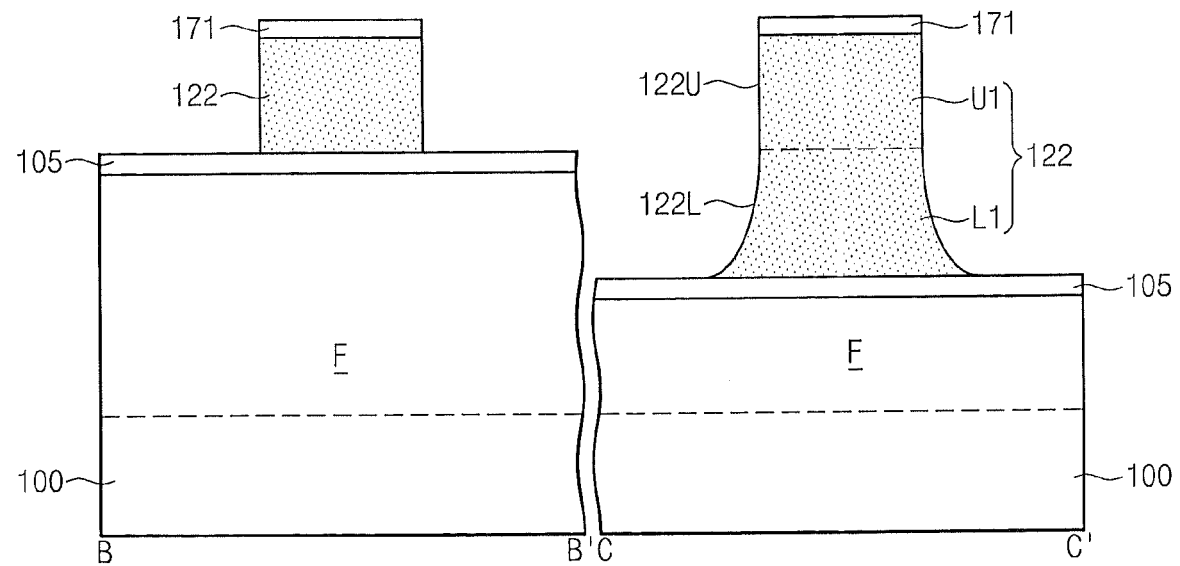
FIGS. 7B, 9B, 11B, 13B, 15B, and 17B are cross-sectional views taken along lines B-B' and lines C-C' of FIGS. 6, 8, 10, 12, 14, and 16, respectively.

Referring to FIGS. 6, 7A, and 7B, another patterning process may be performed using the mask pattern 171 as the etch mask to form a dummy gate 122. The process of forming the dummy gate 122 may include a second etching process having a greater isotropic property than the first etching process. As a result, a width of the dummy gate 122 may become progressively greater toward of a bottom end of the dummy gate 122. In an embodiment, if the first etching process is a plasma etching process, the second etching process may have an applied plasma power less than that of the first etching process or a plasma power may not be applied in the second etching process. As a result, the dummy gate 122 may include an upper portion U1 having a sidewall 122U substantially perpendicular to the top surface of the substrate 100 and a lower portion L1 having a sidewall 122L with a slope that is not perpendicular to the top surface of the substrate 100. The fin active region F may be protected by the protection layer 105 during the etching processes.

Figure 8:
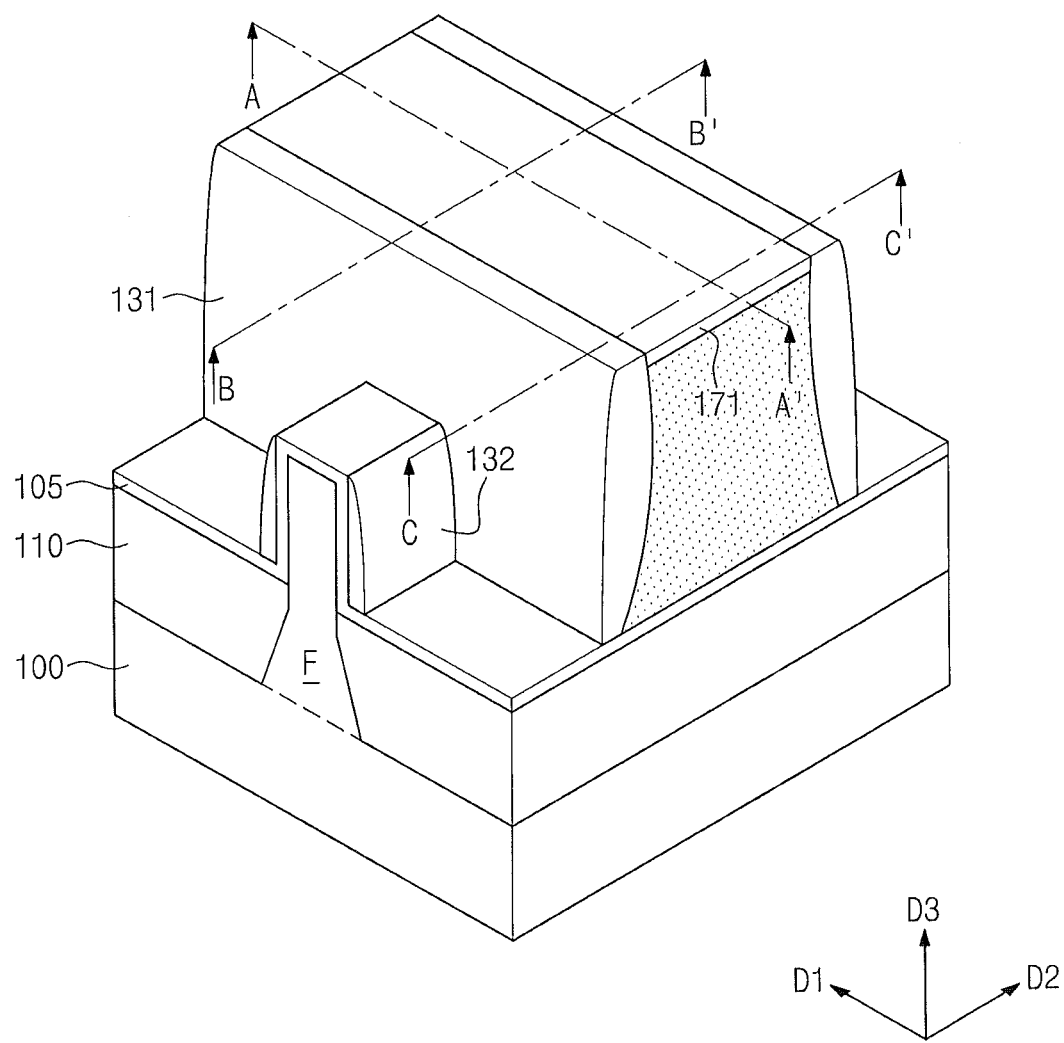
Figure 9A:
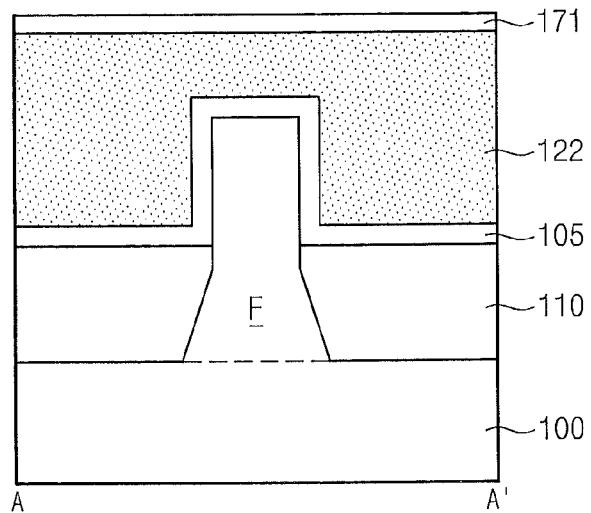
Figure 9B:
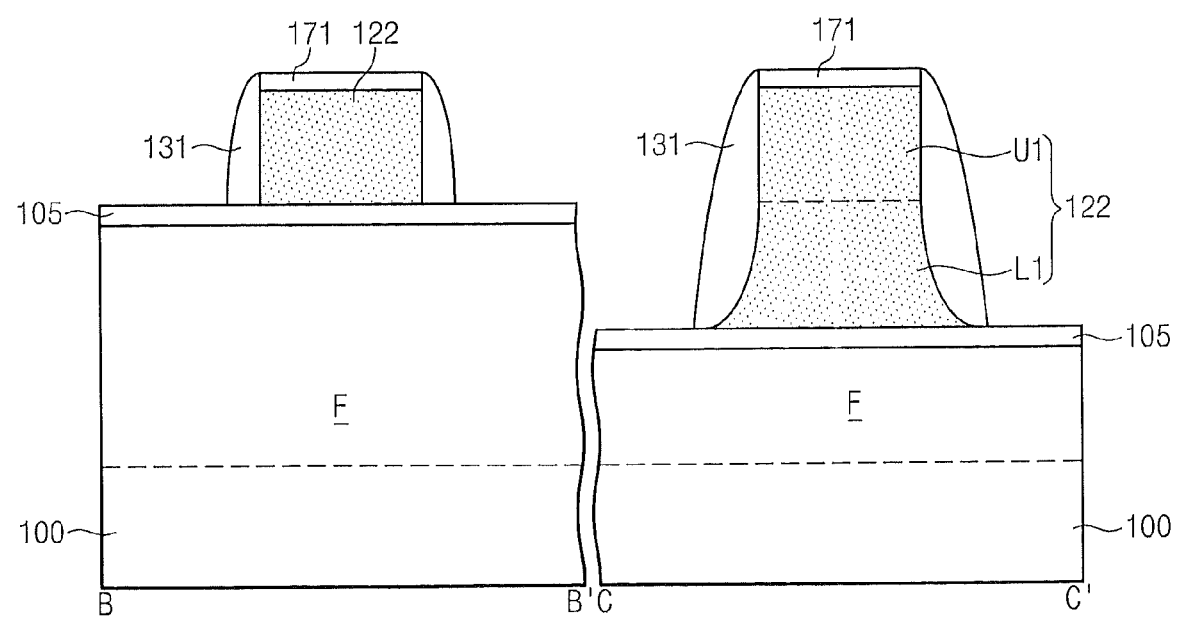

Referring to FIG. 8, 9A, and 9B, after an insulating layer is formed to cover an entire surface of the substrate 100, a dry etching process may be performed on the insulating layer to form a first spacer 131 and a second spacer 132. The first spacer 131 may be formed on a sidewall of the dummy gate 122, and the second spacer 132 may be formed on a sidewall of the fin active region F. For example, the first and second spacers 131 and 132 may include at least one of a silicon oxide layer, a silicon nitride layer, and a silicon oxynitride layer.

Figure 10:
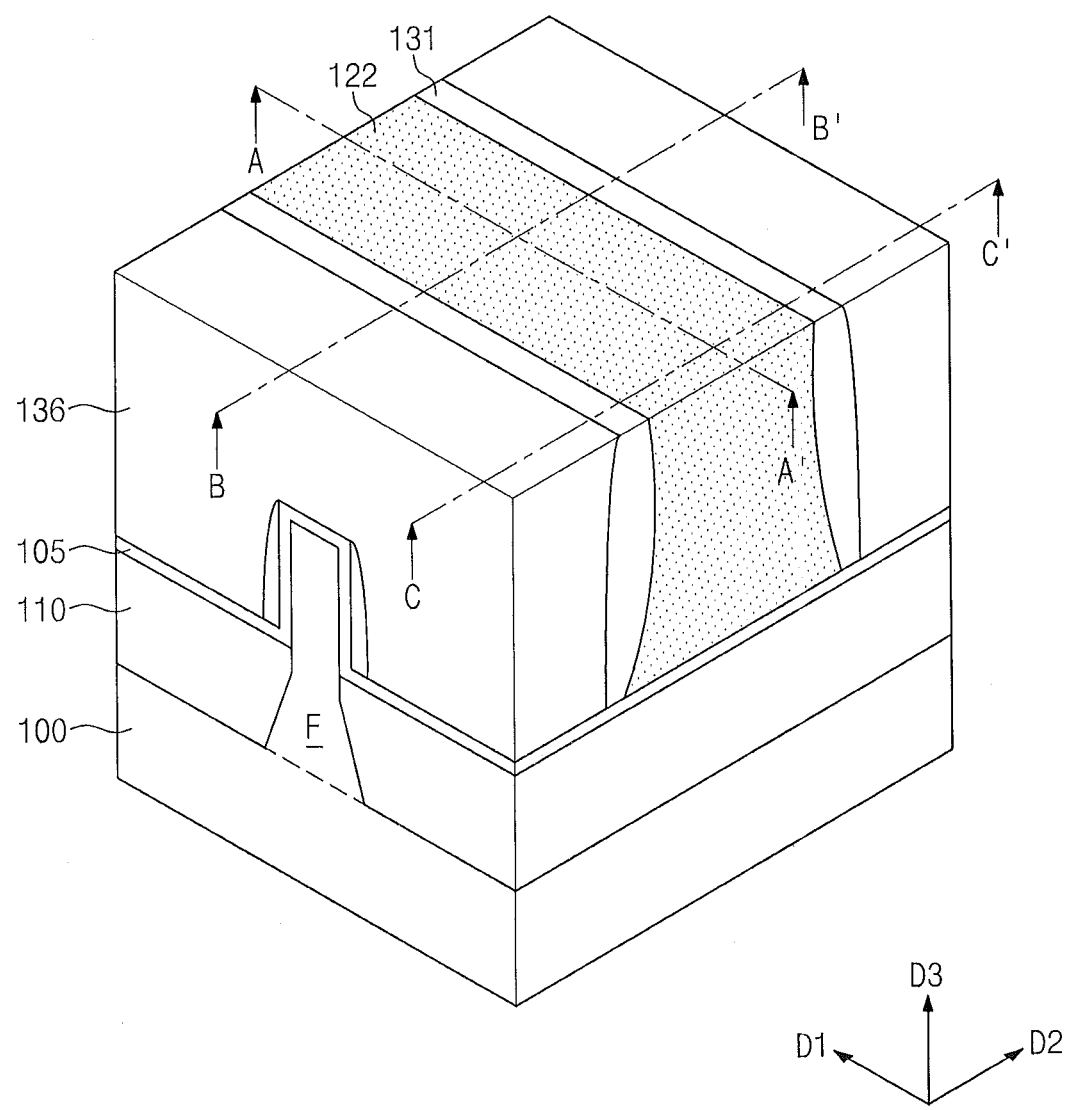
Figure 11A:
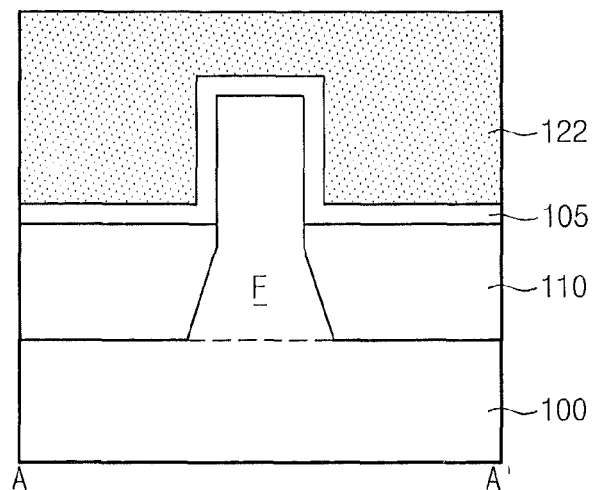
Figure 11B:
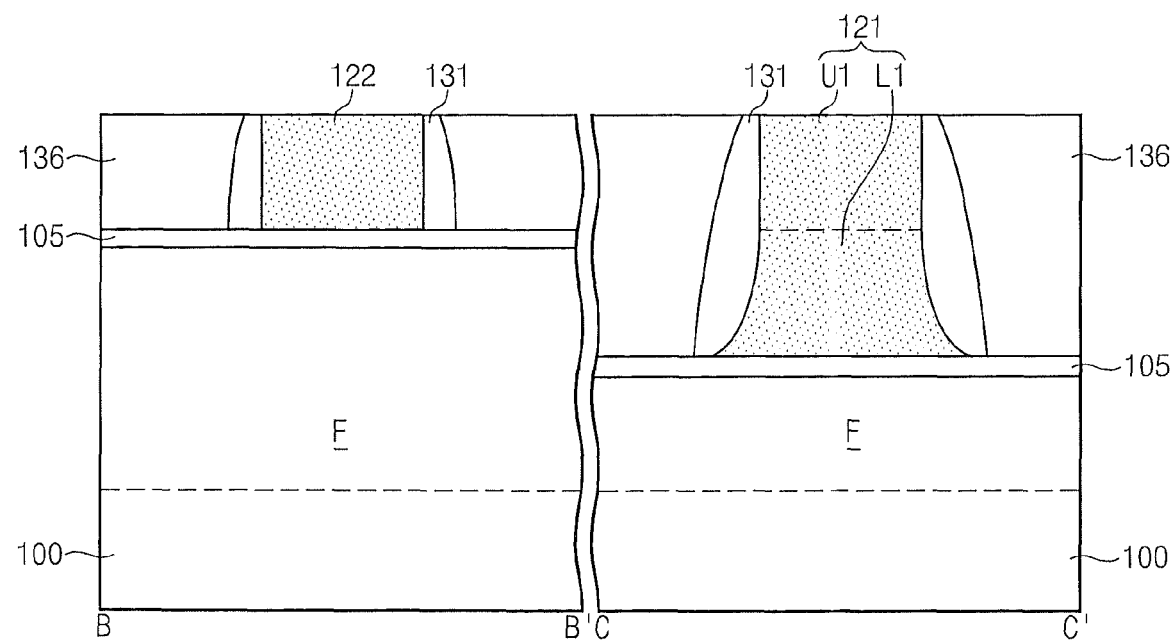

Referring to FIGS. 10, 11A, and 11B, an interlayer insulating layer 136 may be formed to cover the entire surface of the substrate 100 and then a planarization process may be performed on the interlayer insulating layer 136 until a top surface of the dummy gate 122 is exposed. The mask pattern 171 may be removed by the planarization process or may be removed before the planarization process. In an embodiment, the planarization process may be a chemical mechanical polishing (CMP) process.

Figure 12:
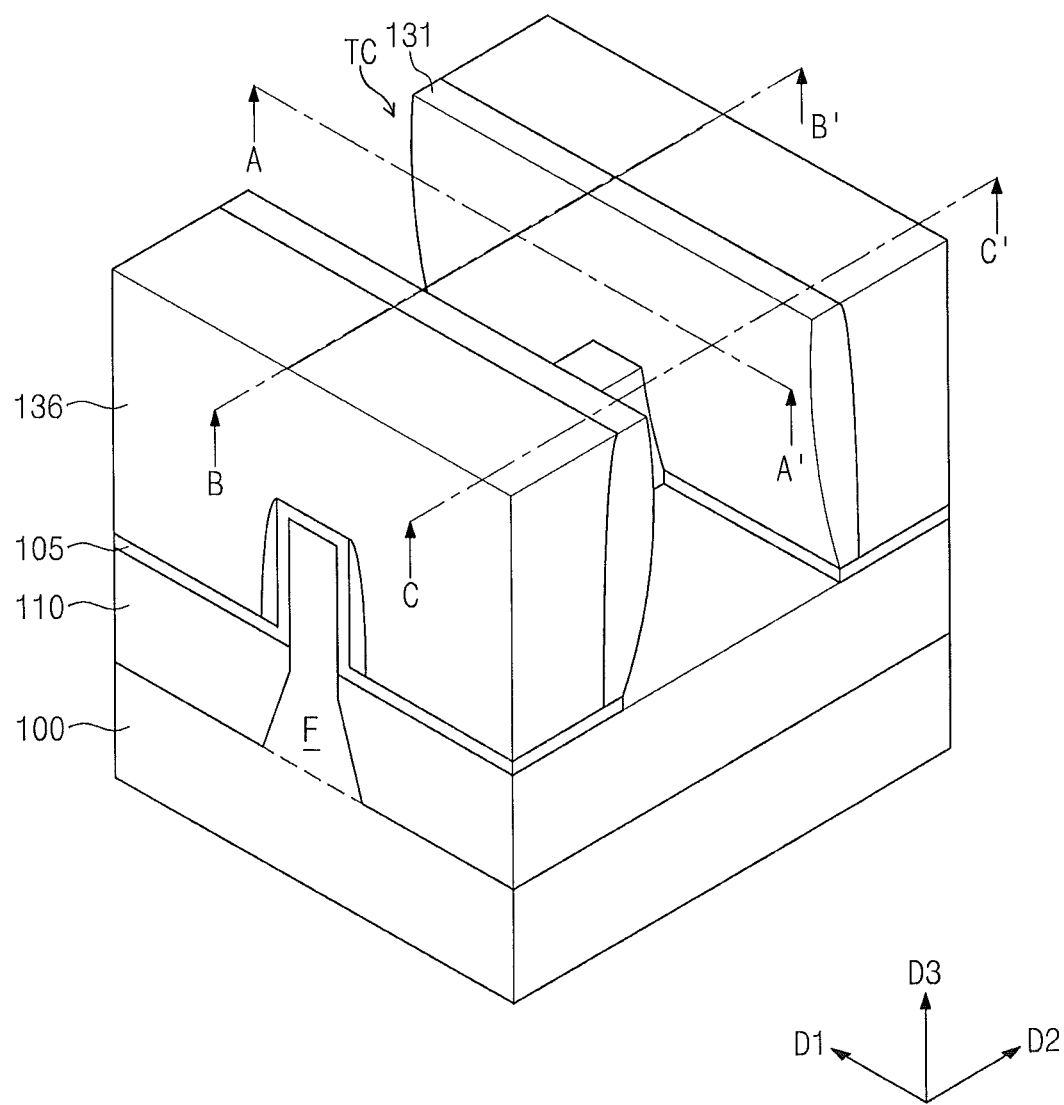
Figure 13A:
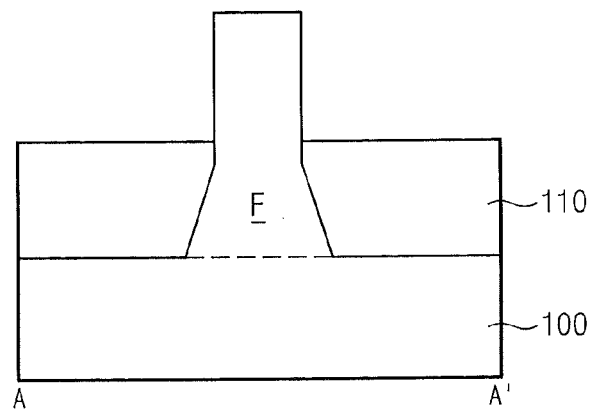
Figure 13B:
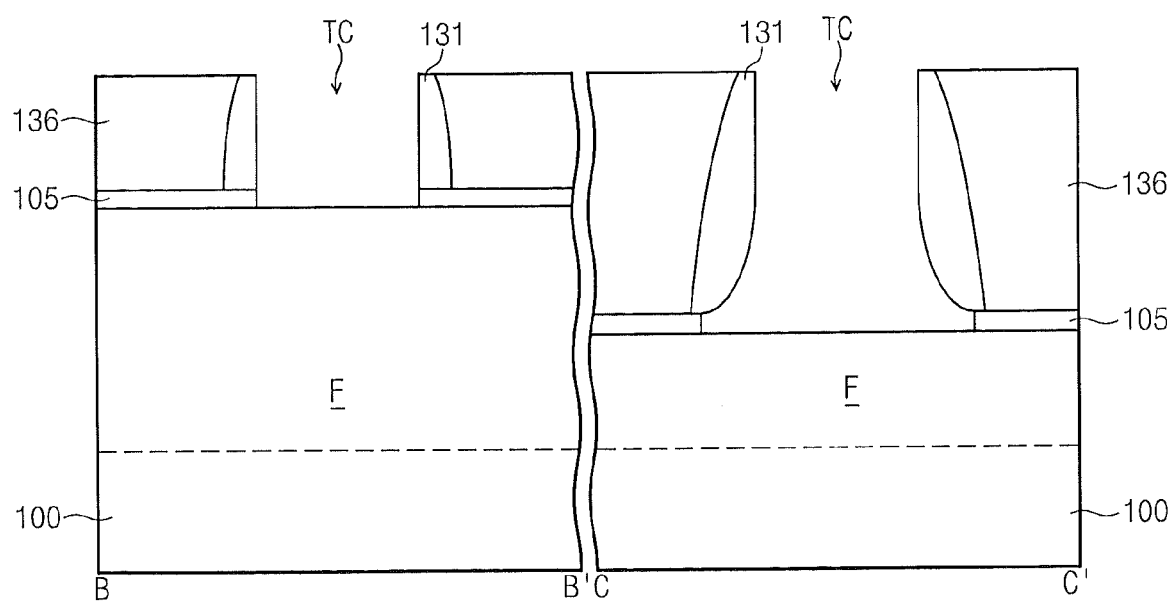

Referring to FIGS. 12, 13A, and 13B, the exposed dummy gate 122 may be removed to form a trench TC. When the dummy gate 122 is removed, the protection layer 105 under the dummy gate 122 may also be removed. The removal of the dummy gate 122 and the protection layer 105 may be performed by a plurality of selective etching processes.

Figure 14:
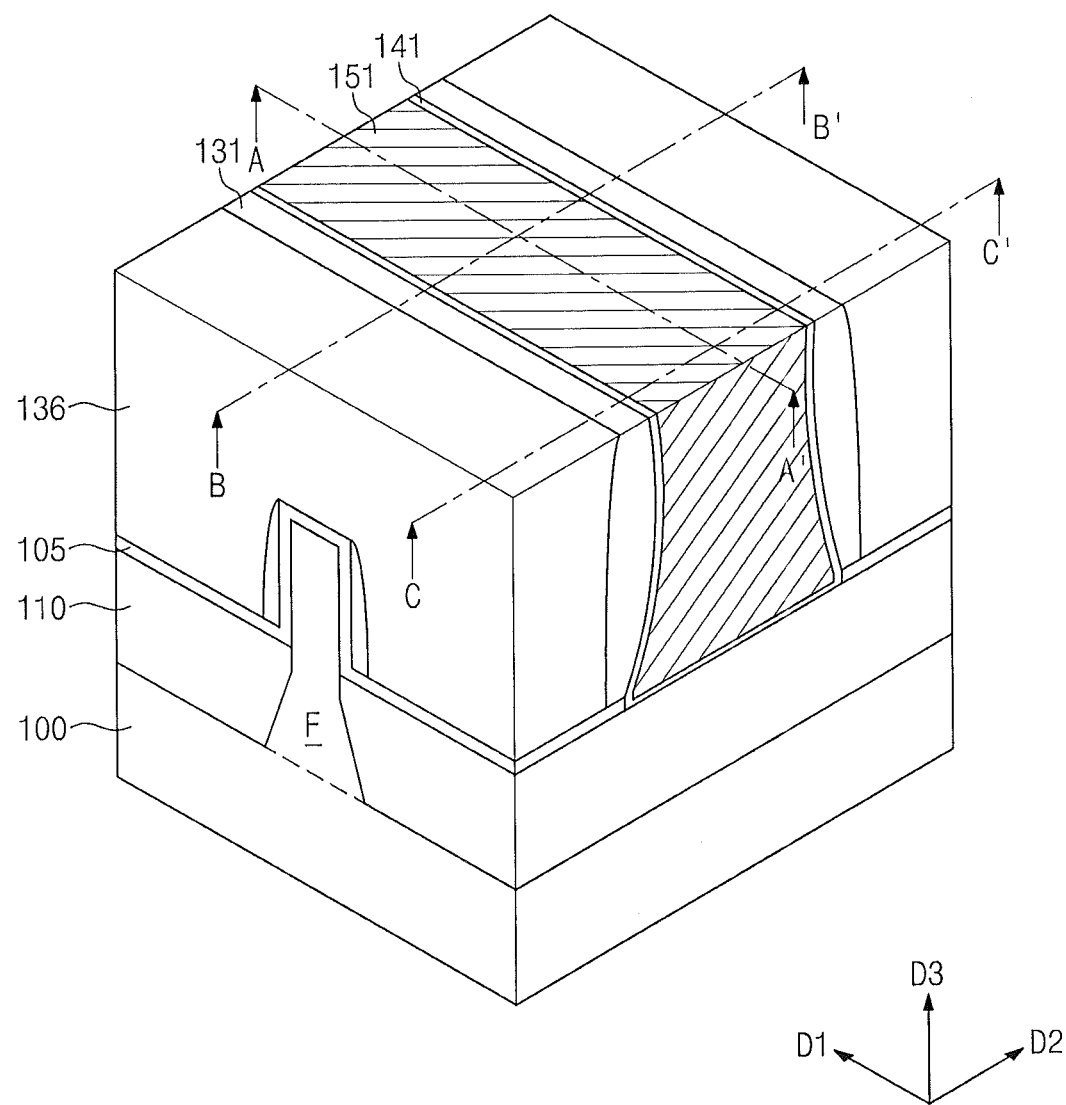
Figure 15A:
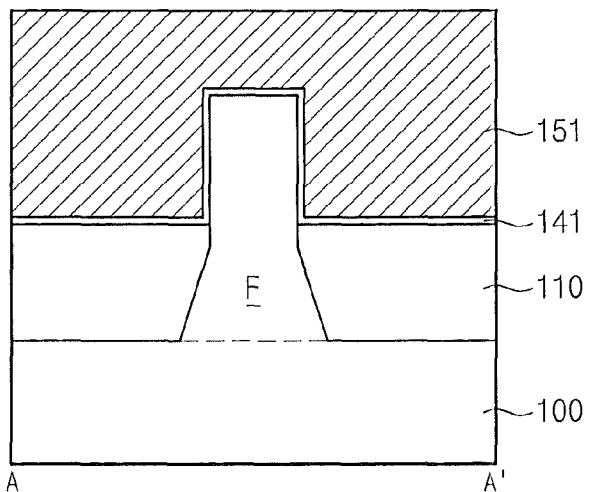
Figure 15B:
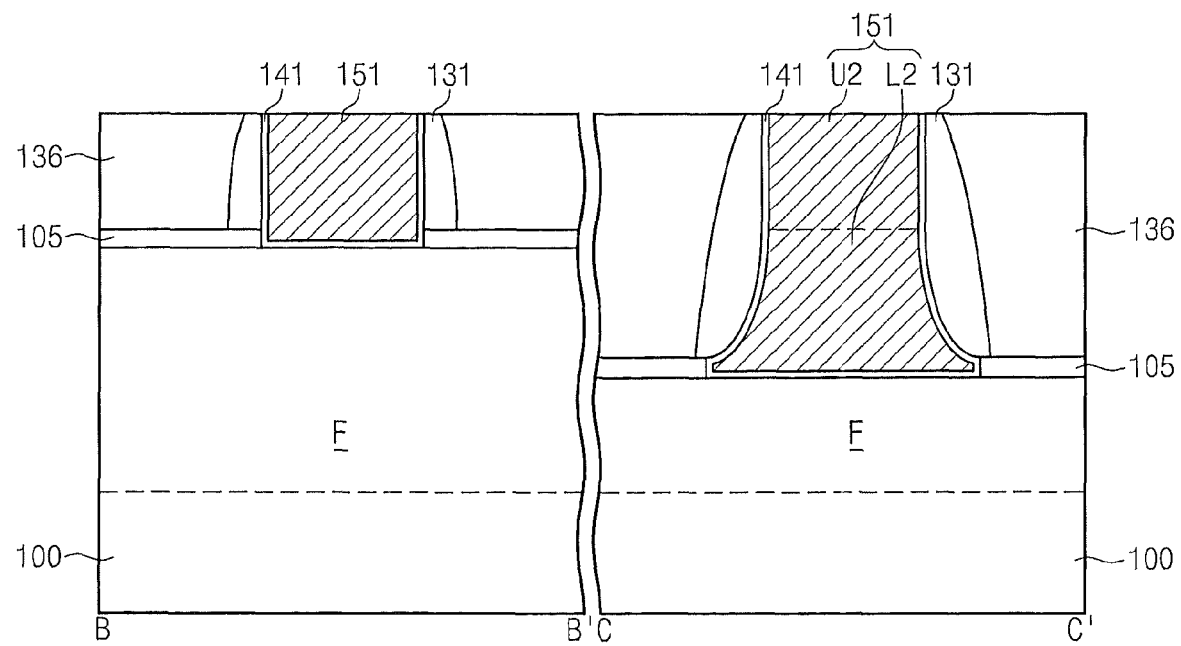

Referring to FIGS. 14, 15A, and 15B, a gate dielectric layer 141 and a gate electrode 151 may be sequentially formed in the trench TC. In an embodiment, the gate dielectric layer 141 may be formed of a high-k dielectric material having a dielectric constant higher than that of silicon oxide. For example, the gate dielectric layer 141 may include hafnium oxide ($HfO_2$), zirconium oxide ($ZrO_2$), or tantalum oxide ($Ta_2O_5$). The gate dielectric layer 141 may be conformally formed along inner sidewalls and a bottom surface of the trench TC. The gate electrode 151 may include at least one metal layer. In an embodiment, the gate electrode 151 may include at least one of titanium, tantalum, tungsten, and aluminum. The gate electrode 151 may be formed by a damascene process using the interlayer insulating layer 136 and the first spacer 131 as a mold.

Figure 16:
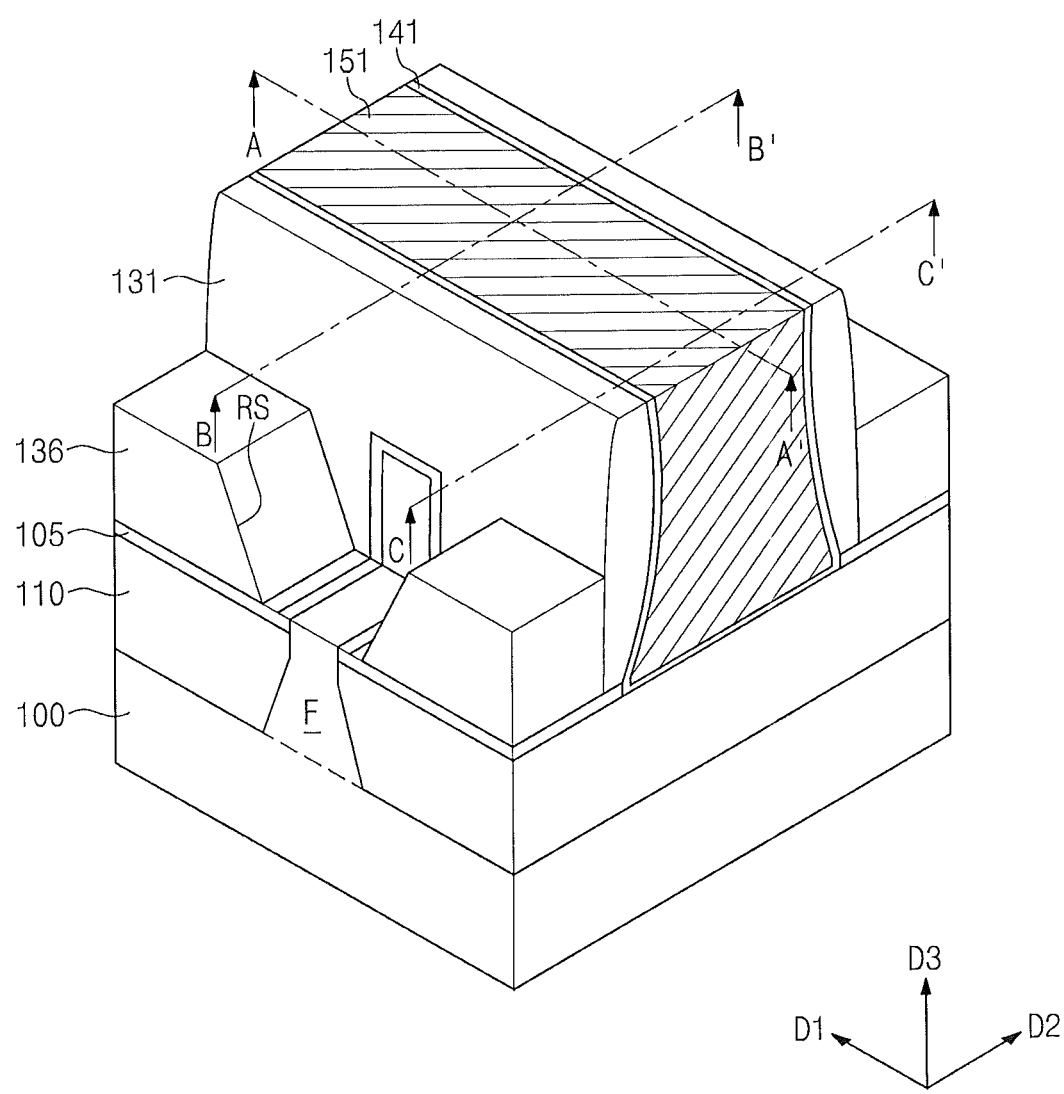
Figure 17A:
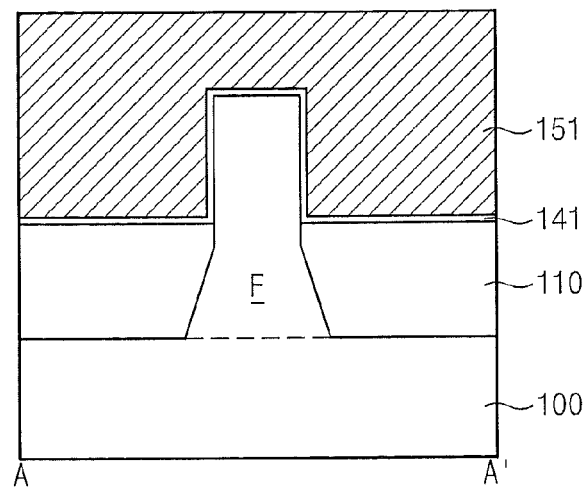
Figure 17B:
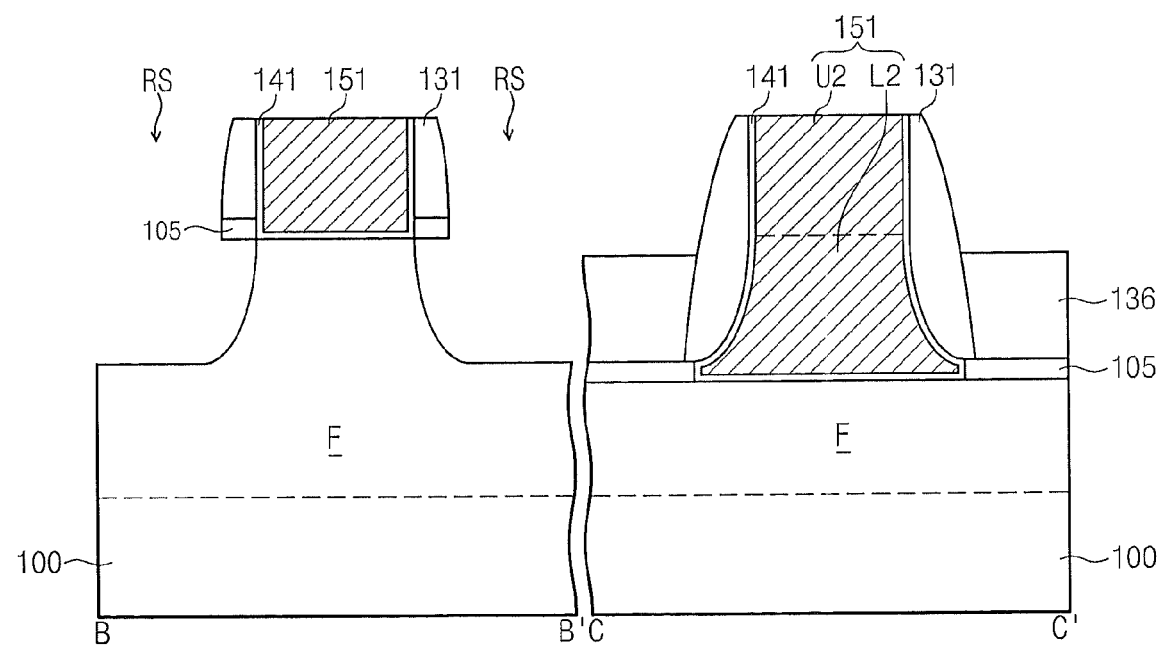

Referring to FIGS. 16, 17A, and 17B, recess regions RS may be formed at both sides of the gate electrode 151, respectively. The interlayer insulating layer 136 and an upper portion of the fin active region F may be patterned to form the recess regions RS. The formation process of the recess regions RS may include a plurality of etching processes. In an example, an upper portion of the interlayer insulating layer 136 and the protection layer 105 may be removed to expose the fin active region F and then the exposed fin active region F may be etched to form the recess regions RS. For reducing or minimizing an etching damage of the fin active region F, the etching process of the fin active region F may be performed using a plasma power that is lower than that of the etching process of the interlayer insulating layer 136 or may be performed in the state that the plasma power is not applied. Thus, the recess regions RS may be formed by a more isotropic etching process. In an embodiment, the recess regions RS may extend to be lower than the first spacer 131 and may have a slope that is not perpendicular to the top surface of the substrate 100. The first spacer 131 may be formed of a material having an etch selectivity with respect to the interlayer insulating layer 136. Thus, the first spacer 136 may protect a sidewall of the gate electrode 151 when the interlayer insulating layer 136 is etched.

Referring again to FIGS. 1, 2A, 2B, and 2C, source/drain regions SD may be formed in the recess regions RS, respectively. The source/drain regions SD may be in contact with sidewalls of the fin active region F exposed by the first spacers 131. The source/drain regions SD and the gate electrode 151 may be insulated from each other by the first spacers 131.

If the field effect transistor is a PMOS transistor, the source/drain regions SD may be compressive stress patterns. In an embodiment, the compressive stress pattern may include a material having a lattice constant greater than that of silicon, for example, a silicon-germanium (SiGe) pattern. The compressive stress pattern may apply a compressive stress to the fin active region F to improve a mobility of charges of a channel region. Alternatively, if the field effect transistor is the NMOS transistor, the source/drain regions SD may be formed of the same material as the substrate 100. In an embodiment, if the substrate 100 is a silicon substrate, the source/drain regions SD may include silicon.

Figure 18:
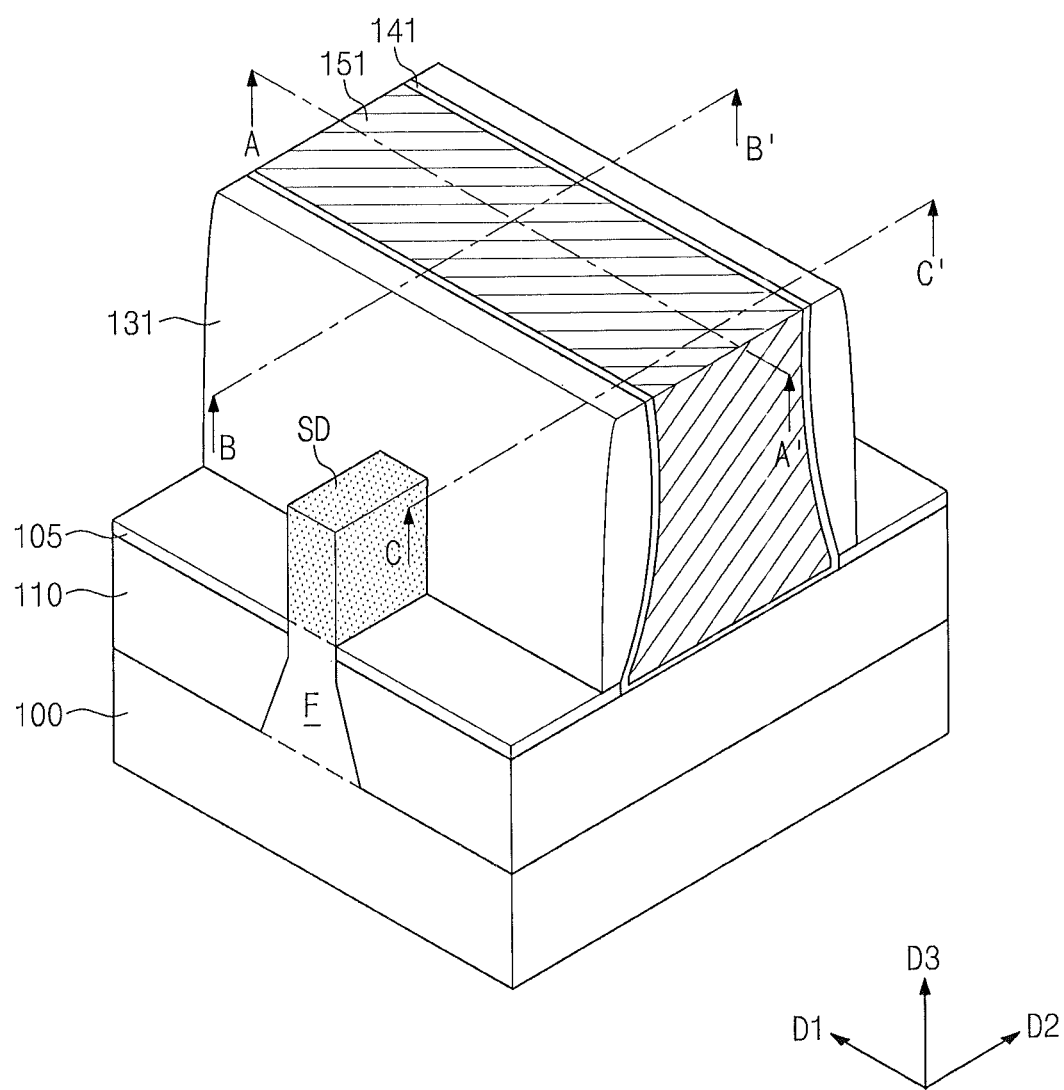
FIG. 18 is a perspective view illustrating a field effect transistor according to other embodiments of the inventive concept.
Figure 19A:
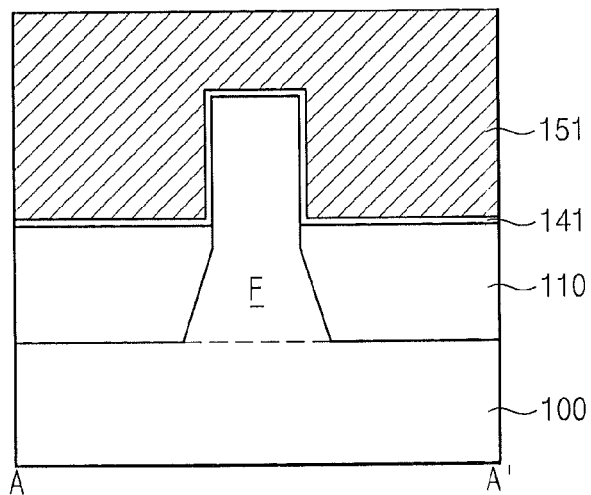
FIG. 19A is a cross-sectional view taken along a line A-A' of FIG. 18.
Figure 19B:
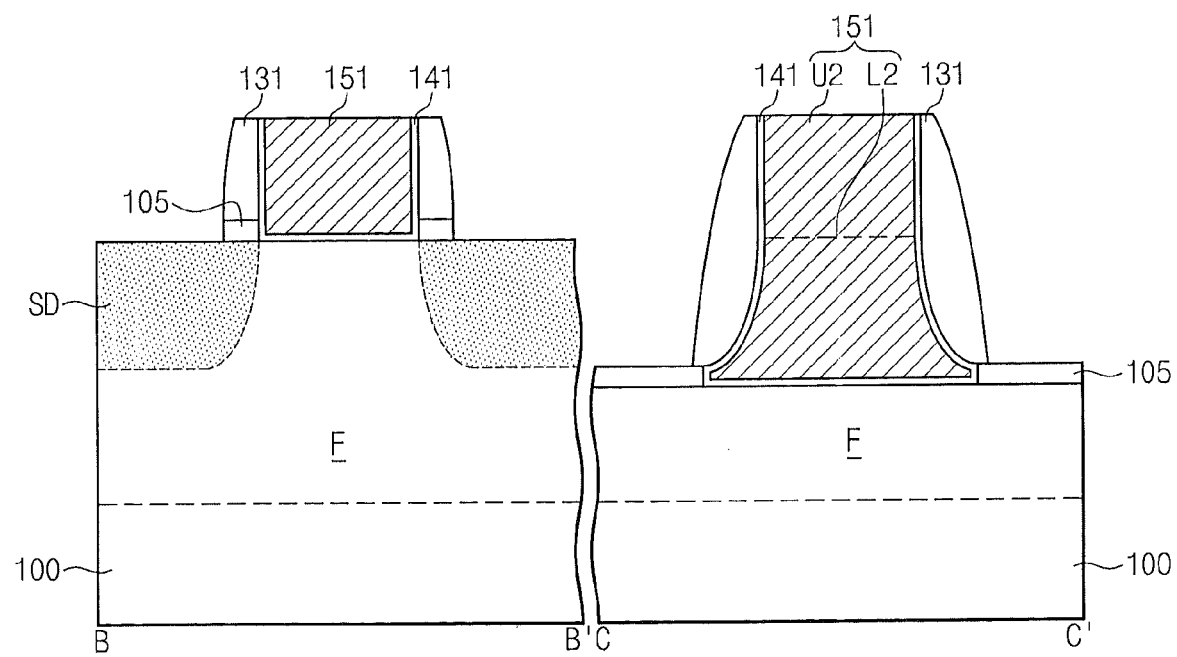
FIG. 19B is a cross-sectional view taken along lines B-B' and C-C' of FIG. 18.

FIG. 18 is a perspective view illustrating a field effect transistor according to other embodiments of the inventive concepts. FIG. 19A is a cross-sectional view taken along a line A-A' of FIG. 18. FIG. 19B is a cross-sectional view taken along lines B-B' and C-C' of FIG. 18. In the present embodiment, the descriptions to the same elements as described in aforementioned embodiment will be omitted or mentioned briefly for the purpose of ease and convenience in explanation.

In the present embodiment, source/drain regions SD may be formed by performing an ion implantation process on an upper portion of the fin active region F exposed by the gate electrode 151. In an embodiment, the ion implantation process may be performed in the step of FIG. 8. However, the inventive concept is not limited thereto. A width of the source/drain region SD formed by the ion implantation process may become progressively less from a top end toward a bottom end of the source/drain region SD. In other words, a sidewall of the source/drain region SD formed by the ion implantation process may also have a slope that is not perpendicular to the top surface of the substrate 100, and the gate electrode 151 in the present embodiment may have an upper portion U2 and a lower portion L2 having a greater width than the upper portion U2 to have a profile corresponding to the source/drain regions SD. Other elements of the present embodiment may be the same as corresponding elements of the aforementioned embodiment.

A field effect transistor according to embodiments of the inventive concept may be formed on a silicon-on-insulator (SOI) substrate. For the purpose of ease and convenience in explanation, the drawings illustrate one transistor formed on one fin active region. In other embodiments, a plurality of fin active regions may be used as an active region of one transistor. In the aforementioned embodiments, the gate electrode 151 may be formed after the removal of the dummy gate 122. However, the inventive concept is not limited thereto. The dummy gate 122 may be used as the gate electrode 151 without the replacement of the gate. In the drawings, the active region of the field effect transistor has the fin active region F. Alternatively, the active region of the field effect transistor may be variously modified. The field effect transistors and the method of forming the same according to the inventive concept may be applied to a static random access memory (SRAM) device, a dynamic RAM (DRAM), a magnetic RAM (MRAM) or another kind of a semiconductor device.

Figure 20:
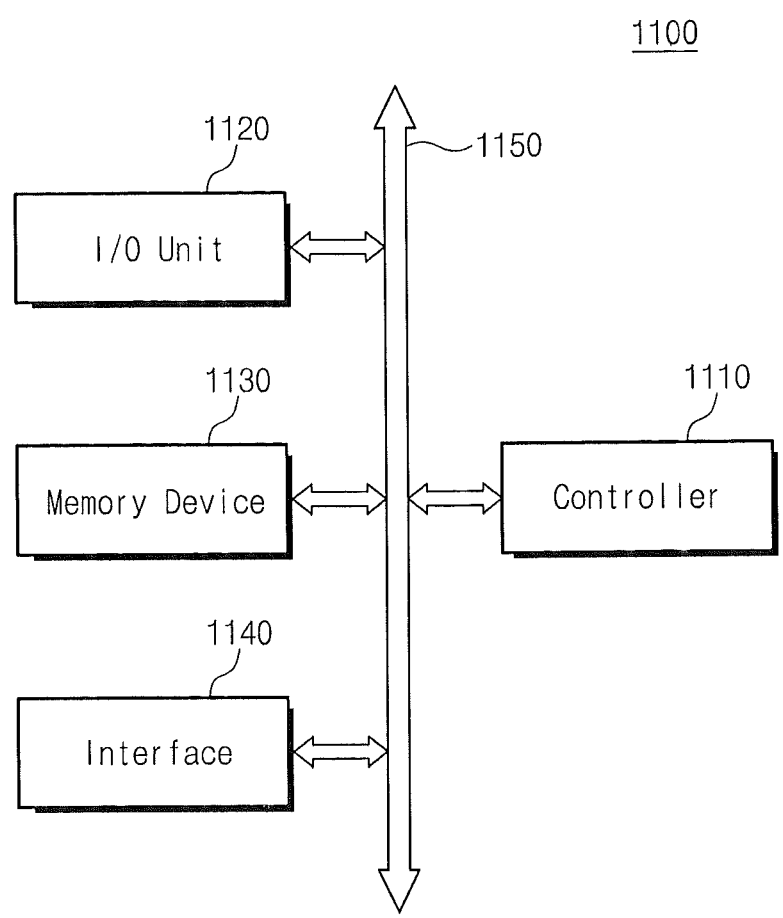
FIG. 20 is a schematic block diagram illustrating an example of electronic systems including field effect transistors according to embodiments of the inventive concept.

FIG. 20 is a schematic block diagram illustrating an example of electronic systems including field effect transistors according to embodiments of the inventive concept.

Referring to FIG. 20, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. The field effect transistors according to the aforementioned embodiments may be provided to the memory device 1130, the controller 1110, and/or the I/O unit 1120.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

According to embodiments of the inventive concept, the sidewall of the active region protruding from the substrate may be effectively used as the channel. Additionally, the short channel effect of the field effect transistor may be relieved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A field effect transistor comprising:
an active region protruding from a substrate;
a gate electrode on the active region; and
source/drain regions on opposite sides of the active region under the gate electrode, respectively,
wherein a width of a lower portion of the gate electrode is greater than a width of an upper portion of the gate electrode; and
wherein a width of a portion of the active region between and contacting the source/drain regions becomes progressively greater from a top end of the active region toward a bottom end of the active region;
wherein a first separation distance between a first line and a second line and adjacent to a top end of the active region is substantially identical to a second separation distance between the first line and the second line and adjacent to a bottom end of the active region;
wherein the first line has a concave slope and corresponds to an interface between the active region and one of the source/drain regions; and
wherein the second line corresponds to a sidewall profile of opposing sidewalls of the gate electrode.

2. The field, effect transistor of claim 1, wherein a sidewall of the gate electrode has a slope that is not perpendicular to a top surface of the substrate.

3. The field effect transistor of claim 2, wherein the sidewall of the gate electrode extends in a direction that is perpendicular to a direction of current flow in the active region between the source/drain regions.

4. The field effect transistor of claim 2, wherein the sidewall of the gate electrode has a concave shape.

5. The field effect transistor of claim 2, wherein an upper sidewall of the gate electrode is substantially perpendicular to a top surface of the substrate; and
wherein a lower sidewall of the gate electrode has a concave shape.

6. The field effect transistor of claim 1, wherein sidewalls of the source/drain regions contacting the active region have convex shapes.

7. The field effect transistor of claim 6, wherein opposing sidewalls of the active region contacting the source/drain regions have concave shapes.

8. The field effect transistor of claim 1, wherein the source/drain regions include a material having a first lattice constant that is greater than a second lattice constant of a material of the active region.

9. The field effect transistor of claim 8, wherein the material of the source/drain regions includes silicon-germanium (SiGe).

10. The field effect transistor of claim 1, further comprising:
a device isolation layer covering a lower sidewall of the active region,
wherein bottom surfaces of the source/drain regions are higher above the substrate than a bottom surface of the device isolation layer.

11. The field effect transistor of claim 1, wherein top surfaces of the source/drain regions are higher than a top surface of the active region.

12. A field effect transistor comprising:
an active region protruding from a substrate;
a gate electrode on the active region; and
source/drain regions on opposite sides of the gate electrode,
wherein interfaces between the active region and the source/drain regions have slopes that are not perpendicular to a top surface of the substrate; and
wherein opposing sidewalls of the gate electrode have slopes that correspond to the slopes of the interfaces;
wherein a first separation distance between a first line and a second line and adjacent to a top end of the active region is substantially identical to a second separation distance between the first line and the second line and adjacent to a bottom end of the active region;
wherein the first line has a concave slope and corresponds to one of the interfaces between the active region and the source/drain regions; and
wherein the second line corresponds to a sidewall profile of the opposing sidewalls of the gate electrode.

13. The field effect transistor of claim 12, wherein a lower width of the gate electrode between the source/drain regions is greater than an upper width of the gate electrode between the source/drain regions.

14. The field effect transistor of claim 12, wherein the opposing sidewalls of the gate electrode have concave shapes.

15. The field effect transistor of claim 12, wherein sidewalls of the active region contacting the source/drain regions have concave shapes.

16. A field effect transistor comprising:
a substrate;
a fin-shaped active region protruding from the substrate and extending in a first direction, the fin-shaped active region including an upper surface and opposing side surfaces;
a gate electrode on the upper surface and opposing side surfaces of the active region; and
source/drain regions on opposite ends of the active region, wherein the source/drain regions are spaced apart in the first direction;
wherein a width of a lower portion of the fin-shaped active region in the first direction is greater than a width of an upper portion of the fin-shaped active region in the first direction;
wherein a width of a lower portion of the gate electrode in the first direction is greater than a width of an upper portion of the gate electrode in the first direction;
wherein a first separation distance between a first line and a second line and adjacent to a top end of the fin-shaped active region is substantially identical to a second separation distance between the first line and the second line and adjacent to a bottom end of the fin-shaped active region;
wherein the first line has a concave slope and corresponds to an interface between the fin-shaped active region and the source/drain regions; and
wherein the second line corresponds to a sidewall profile of opposing sidewalls of the gate electrode.

17. The field effect transistor of claim 16, wherein the gate electrode includes opposing surfaces that extend in a second direction that is perpendicular to the first direction, and wherein lower portions of the opposing surfaces of the gate electrode are not perpendicular to an upper surface of the substrate.

18. The field effect transistor of claim 17, wherein the active region includes opposing end surfaces adjacent the source/drain regions and extending in the second direction, and wherein lower portions of the opposing end surfaces of the active region are not perpendicular to the upper surface of the substrate.

19. The field effect transistor of claim 18, wherein the lower portions of the opposing surfaces of the gate electrode and the lower portions of the opposing end surfaces of the active region have concave shapes.

* * * * *